United States Patent
Murugan et al.

(10) Patent No.: US 12,218,036 B2
(45) Date of Patent: Feb. 4, 2025

(54) PACKAGE SUBSTRATE HAVING INTEGRATED PASSIVE DEVICE(S) BETWEEN LEADS

(71) Applicant: Texas Instruments Incorporated, Dallas, TX (US)

(72) Inventors: Rajen Manicon Murugan, Dallas, TX (US); Yiqi Tang, Allen, TX (US)

(73) Assignee: TEXAS INSTRUMENTS INCORPORATED, Dallas, TX (US)

( * ) Notice: Subject to any disclaimer, the term of this patent is extended or adjusted under 35 U.S.C. 154(b) by 50 days.

(21) Appl. No.: 18/177,273

(22) Filed: Mar. 2, 2023

(65) Prior Publication Data

US 2023/0207430 A1 Jun. 29, 2023

Related U.S. Application Data

(62) Division of application No. 17/233,205, filed on Apr. 16, 2021, now Pat. No. 11,600,555.

(Continued)

(51) Int. Cl.

| | |
|---|---|
| *H01L 23/495* | (2006.01) |
| *H01L 21/48* | (2006.01) |
| *H01L 21/56* | (2006.01) |
| *H01L 23/00* | (2006.01) |
| *H01L 23/31* | (2006.01) |

(52) U.S. Cl.
CPC .... *H01L 23/49534* (2013.01); *H01L 21/4821* (2013.01); *H01L 21/563* (2013.01); *H01L 21/565* (2013.01); *H01L 23/3107* (2013.01); *H01L 23/49558* (2013.01); *H01L 23/49575* (2013.01); *H01L 23/49589* (2013.01); *H01L 24/16* (2013.01); *H01L 2224/16245* (2013.01)

(58) Field of Classification Search
CPC ........... H01L 23/49534; H01L 21/4821; H01L 21/563; H01L 21/565; H01L 23/3107; H01L 23/49558; H01L 23/49575; H01L 23/49589; H01L 24/16; H01L 2224/16245
USPC ........................................... 257/676
See application file for complete search history.

(56) References Cited

U.S. PATENT DOCUMENTS

| | | | |
|---|---|---|---|
| 8,033,014 B2 | 10/2011 | Yu et al. | |
| 2019/0096864 A1* | 3/2019 | Huitema | ................. H01L 24/24 |

OTHER PUBLICATIONS

Texas Instruments, "Hotrod QFN Package PCB Attachment," Application Report, May 2014, pp. 1-11.

* cited by examiner

*Primary Examiner* — Caleb E Henry
*Assistant Examiner* — Dilinh P Nguyen
(74) *Attorney, Agent, or Firm* — Yudong Kim; Frank D. Cimino

(57) ABSTRACT

A semiconductor package includes a multilayer package substrate with a top layer including top filled vias through a top dielectric layer and top metal layer providing a top surface for leads and traces connected to the leads, and a bottom layer including bottom filled vias including contact pads through a bottom dielectric and metal layer. The top filled vias are for connecting the bottom and top metal layer. The bottom metal filled vias are for connecting the bottom metal layer to the contact pads. An integrated circuit (IC) die has nodes in its circuitry connected to the bond pads. The IC die is flipchip mounted onto the leads. A passive device(s) is surface mounted by an electrically conductive material on the top metal layer electrically connected between at least one adjacent pair of the leads. A mold compound is for encapsulating at least the IC die and passive device.

20 Claims, 5 Drawing Sheets

Related U.S. Application Data

(60) Provisional application No. 63/011,296, filed on Apr. 17, 2020.

PACKAGE SUBSTRATE HAVING INTEGRATED PASSIVE DEVICE(S) BETWEEN LEADS

CROSS-REFERENCE TO RELATED APPLICATION

This Application is a divisional of U.S. patent application Ser. No. 17/233,205, entitled "PACKAGE SUBSTRATE HAVING INTEGRATED PASSIVE DEVICE(S) BETWEEN LEADS," filed Apr. 16, 2021, which claims the benefit of U.S. Provisional Application No. 63/011,296, entitled "Re-routable Passive Component using Routable Leadframe Technology," filed Apr. 17, 2020, and each of which is hereby incorporated by reference in its entirety herein.

FIELD

This Disclosure relates to multilayer package substrates, and a packaged semiconductor device comprising a multilayer package substrate along with discrete passive devices such as capacitors or resistors.

BACKGROUND

In a flipchip on leadframe package arrangement, an integrated circuit (IC) die having solder bumps on its bond pads, or solder on pillars that are on the bond pads, is flipped onto leads (or pins) of a leadframe. Flipchip assembly technology is widely utilized in semiconductor packaging due to its short interconnect paths compared to wire bonds between the IC die and the leadframe or other substrate, which eliminates the space needed for wire bonding, and thus reduces the overall size of the package. In addition, the elimination of wire bonds reduces undesired parasitic inductance, thereby making the flipchip package configuration attractive for high-frequency applications.

Some packaged devices, such as power devices, for example, power converters, also need discrete devices, generally being capacitors placed between certain of the packaged device's leads. Conventionally these discrete devices, such as capacitors, are surface mounted on the printed circuit board (PCB) in positions to be located between the desired leads, such as being between the VIN and GND leads of a Quad flat no lead (QFN) HOTROD power package from Texas Instruments Inc. The HOTROD power package is a thermally enhanced plastic power package that uses a copper leadframe technology without any bond wires implemented by flipchip attaching a power IC die having solder bumps on pillars that are on its bond pads directly onto leads of the leadframe. This arrangement improves the electrical and thermal performance over traditional wirebonded leaded packages, and also improves the efficiency of the power device by eliminating conventional wirebond connection between the IC die and the leads of the leadframe which minimizes package parasitics.

SUMMARY

This Summary is provided to introduce a brief selection of disclosed concepts in a simplified form that are further described below in the Detailed Description including the drawings provided. This Summary is not intended to limit the claimed subject matter's scope.

Disclosed aspects recognize a multilayer package substrate, sometimes referred to as a routable leadframe (RLF), with its advanced design rules enables the re-routing of leads, such as in the case of a power device package having the VIN lead and the GND lead, to be brought into proximity to one another. Such lead proximity enables passive device integration between the leads of the semiconductor device package without any change to the design of the IC die. Disclosed passive device integration between at least one pair of leads of the power device package saves valuable customer PCB space that would otherwise be needed for passive devices to be conventionally placed on the PCB between certain leads of the power device package, and also provides improved electrical performance by reducing the loop inductance and the parasitic capacitance.

Moreover, the other known method of adding passive devices to semiconductor packages that comprises embedding passive device(s) within a layer of a laminate substrate is recognized to be relatively expensive. Disclosed embedding of passive devices between at least one pair of leads using a connection comprising a top metal layer (that can be a direct connection using only top metal layer, or can optionally include a lower metal level for bridging between spaced apart top metal level of a multilayer package substrate is recognized to be relatively inexpensive assembly method due to relative simplicity of mounting surface mount (SMT) components. Moreover, the reliability of the power device package is improved because SMT is usually the last step of the disclosed package assembly before the molding process. In contrast known passive device embedding involves a plurality of process steps, where the processes that come after placing the passive device components can cause stress to the joints of the passive component device joints. Conventional embedding of passive devices also generally needs tightly controlled package dimensions, and variations in these dimensions cause failures.

Disclosed aspects include a semiconductor package that includes a multilayer package substrate that has a top layer including top filled vias through a top dielectric layer and top metal layer providing a top surface for a plurality of leads, and a plurality of traces connected to the leads. A bottom layer includes bottom filled vias including contact pads through a bottom dielectric layer and bottom metal layer. The metal filled vias are for connecting the bottom metal layer to the top metal layer, and the bottom metal filled vias are for connecting the bottom metal layer to the contact pads. An IC die has a semiconductor surface including circuitry, with nodes in the circuitry electrically connected to bond pads. The IC die is flipchip mounted onto the leads to provide an electrical connection to the bond pads. A passive device(s) is surface mounted by an electrically conductive material on the top metal layer electrically connected between at least one adjacent pair of the leads. A mold compound is for encapsulating at least the IC die and the passive device.

BRIEF DESCRIPTION OF THE DRAWINGS

Reference will now be made to the accompanying drawings, which are not necessarily drawn to scale, wherein.

Figure 1A:
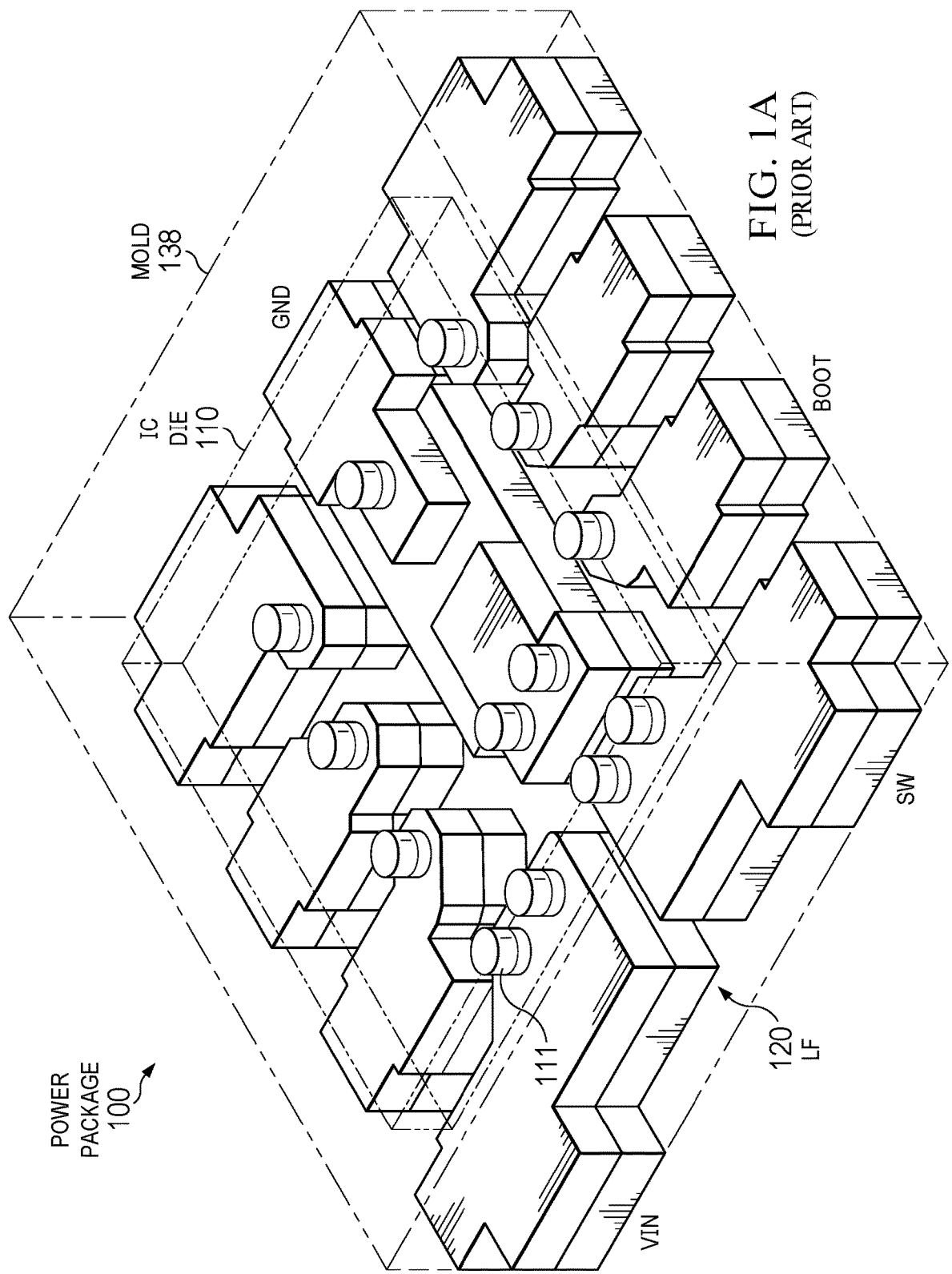
FIG. 1A is a top perspective view of a known flipchip power package with a look-through view of the flipchip mounted IC die to show features not otherwise visible in the power device package, with some leads of the leadframe (LF) identified including VIN, GND, Boot, and switch (SW).

Step 305 comprises adding pillars, that generally comprise copper, onto the bond pads of the IC die of a wafer that includes a plurality of the IC die. The resulting bumped wafer is shown. Step 306 comprises solder dipping the bumped wafer with generally a solder flux material, with the resulting bumped wafer after solder fluxing shown. Wafer singulation then generally follows to provide a plurality of singulated IC die.

Step 307 comprises flipchip mounting respective ones of the IC die, generally using pick and place, to flip singulated IC die shown as onto each of a plurality of disclosed package substrates, which as described above are generally physically interconnected to one another as a panel. Step 308 comprises mounting SMT components shown as capacitors C1, C2, and C3. The result following steps 307 and 308 reflects the mounting of the IC die and the capacitors C1, C2, and C3 onto the package substrate. Step 309 comprises molding to form an encapsulating mold, followed by singulating the molded packages, with a resulting flipchip power package shown.

DETAILED DESCRIPTION

Example aspects are described with reference to the drawings, wherein like reference numerals are used to designate similar or equivalent elements. Illustrated ordering of acts or events should not be considered as limiting, as some acts or events may occur in different order and/or concurrently with other acts or events. Furthermore, some illustrated acts or events may not be required to implement a methodology in accordance with this Disclosure.

Also, the terms "coupled to" or "couples with" (and the like) as used herein without further qualification are intended to describe either an indirect or direct electrical connection. Thus, if a first device "couples" to a second device, that connection can be through a direct electrical connection where there are only parasitics in the pathway, or through an indirect electrical connection via intervening items including other devices and connections. For indirect coupling, the intervening item generally does not modify the information of a signal but may adjust its current level, voltage level, and/or power level.

Several terms used herein will now be defined. A multilayer package substrate as used herein generally referred to as simply a "package substrate" is a particular package substrate arrangement that comprises a plurality (at least two) of stacked layers where each layer is pre-configured with metal plating such as copper plating or interconnects to provide electrical connections in the package. Thus, disclosed package substrates can consist of just two layers (top layer and bottom layer, or three or more layers. Such a multilayer package substrate is generally built by forming a dielectric layer such as a mold compound (generally comprising an epoxy material) or other organic compound(s) around a leadframe substrate comprising a metal material between a patterned top metal layer and a patterned metal bottom layer. Such package substrates can comprise single- or multi-die configurations, both lateral and vertically stacked, enabling low-profile, fine-pitch packages, which enable different stackups, material, and manufacturing process, that has recognized benefits when applied to disclosed aspects.

An IC die as used herein comprises a substrate having at least a semiconductor surface (generally an all-semiconductor substrate, such as comprising silicon having an optional epitaxial layer thereon), where there were circuit elements (including transistors, and generally diodes, resistors, capacitors, etc.) formed in the semiconductor surface that are configured together for generally realizing at least one circuit function. Various nodes of the circuitry are coupled to bond pads on the top side of the IC, where the bond pads generally comprise the top layer metal. The IC can generally comprise a power device.

FIG. 1A is a top perspective view of a known flipchip power package 100 with a look-through view of the flipchip mounted IC die 110 to show features not otherwise visible in the power device package, with some leads (or pins) of the LF 120 identified including VIN, GND, Boot, and switch (SW). Power package 100 evidences that it is not reasonably possible to position passive devices, such as SMT capacitors, for example between the VIN lead and the GND lead. The IC die 110 is shown having pillars 111 which may have their tips solder coated, where solder can be dipped unto the pillar 111 at a later stage during assembly which can take place at an assembly factory. The pillars 111 are on bond pads (not shown) of the IC die 110, and the bond pads are connected to nodes in the circuitry of the IC die 110.

Figure 1B:
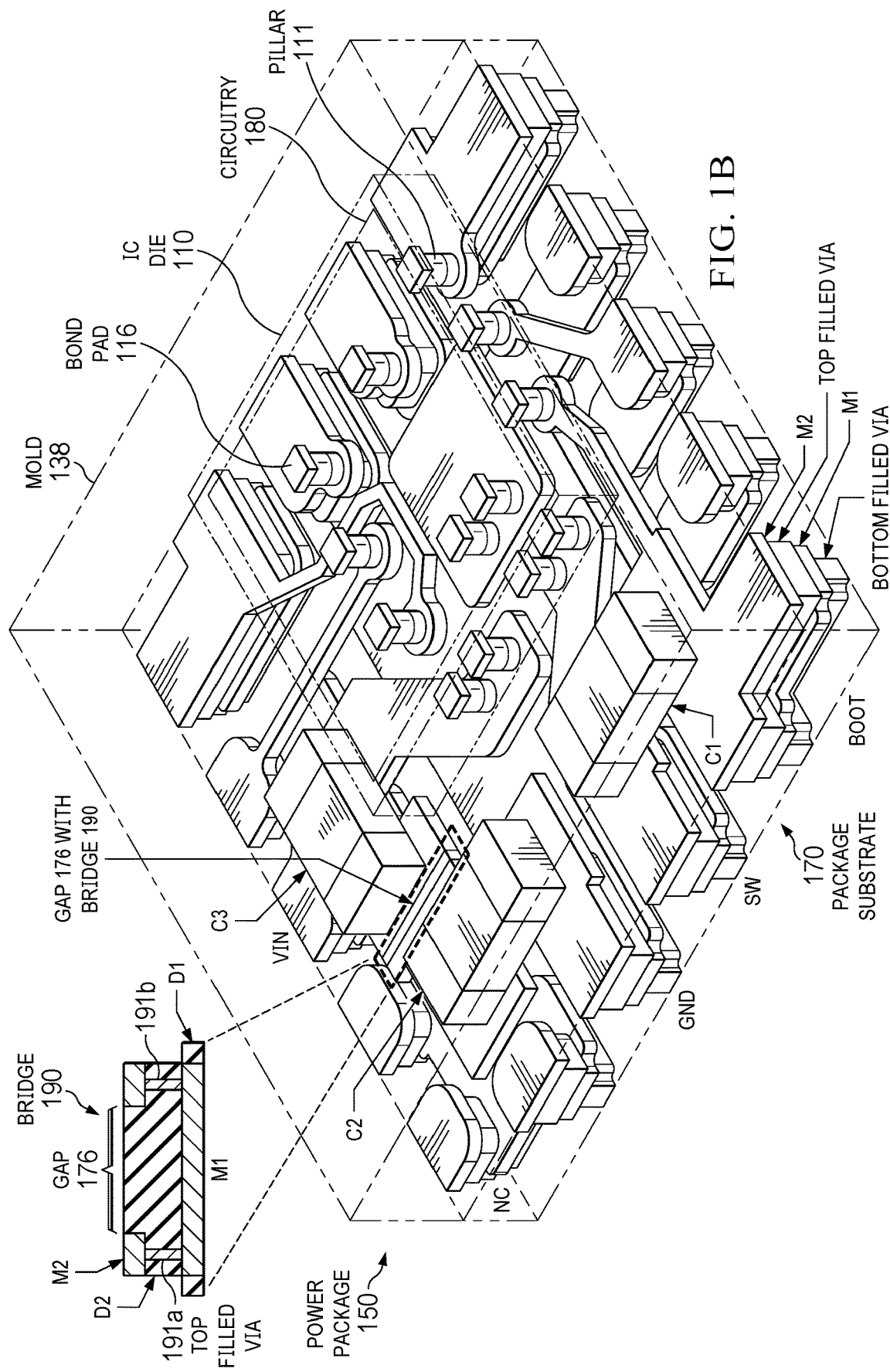
FIG. 1B is a top perspective view of an example flipchip power package with a look-through view of the flipchip mounted IC die to show features of a multilayer package substrate not otherwise visible, with some leads of the package substrate again identified including VIN, GND, Boot, and SW leads, according to an example aspect. An optional disclosed internal bridge is also shown including top filled vias under M2 and on M1 that function to connect C2 to C3 in series. A no-connect (NC) lead is also shown.

FIG. 1B is a top perspective view of an example flipchip power package 150 with a look-through view of the flipchip mounted IC die to show features of a multilayer package substrate 170 not otherwise visible, with some leads of the package substrate 170 again identified including VIN, GND, Boot, and SW leads. Although the multilayer package substrate 170 is shown in FIG. 1B consisting of only a top layer and a bottom layer, as noted above disclosed multilayer package substrates can also include three or more layers. A no connect (NC) lead is also shown. The spacing between the leads is generally less than 0.6 mm between neighboring leads. For example, a pitch for the leads may be about 0.5 mm, meaning a lead spacing of around 0.25 mm. The maximum distance between leads generally depends on the SMT device size. For common SMT capacitors known as 0201, maximum lead spacing may be about 0.4 mm, and for 0402 capacitors the maximum lead spacing may be about 0.8 mm.

The multilayer package substrate 170 is shown comprising two layers, a bottom layer comprising a bottom metal layer shown M1 and bottom filled vias through a bottom dielectric layer D1, and a top layer on the bottom layer comprising top filled vias through a top dielectric layer shown as D2, and a top metal layer shown as M2. However, disclosed package substrates can include three or more layers. Power package 150 includes the integration of three passive devices shown as SMT capacitors C1, C2, and C3 enabled by the re-routing of traces on M2 of the package substrate 170.

The IC die 110 for power package 150 is the same as the IC die 110 for the power package 100 shown in FIG. 1A. The IC die 110 in FIG. 1B now shows its circuitry 180, where selected nodes of the circuitry 180 are electrically coupled to bond pads 116 that include pillars 111 thereon. The circuitry comprises circuit elements (including transistors, and generally diodes, resistors, capacitors, etc.) and may be formed in the epitaxial layer on a bulk substrate material, such as silicon, configured together for generally realizing at least one circuit function. Example circuit functions include analog (e.g., a power analog device, such as a power converter, a power amplifier, power switch, power regulator, DC/DC converter, or an AC/DC converter, radio frequency (RF) device, digital device, or non-volatile memory functions.

C3 and C2 are shown connected in series by a disclosed bridge 190 between the VIN lead and the GND lead, and C1 is shown positioned between Boot lead and the SW lead. The connection between C3 and C2 is across a gap 176 in M2, that is bridged by a bridge 190 shown as an inset comprising top filled vias shown as 191a and 191b that are formed through a top dielectric layer shown as D2 that connect M2 to M1 on both sides of the gap 176. There is also shown a bottom dielectric layer as D1 lateral to M1 that, although not shown, extends below M1 and includes bottom filled vias that connect to contact pads provided by the bottom filled vias. The bridge 190 is not possible with other leadframe based technology which will require a bus-bar connecting to the outside of the package. Mold is again shown as 138. The capacitors C1-C3 can be seen to be encapsulated by the mold 138, thus being embedded in the power package 150.

Figure 1C:
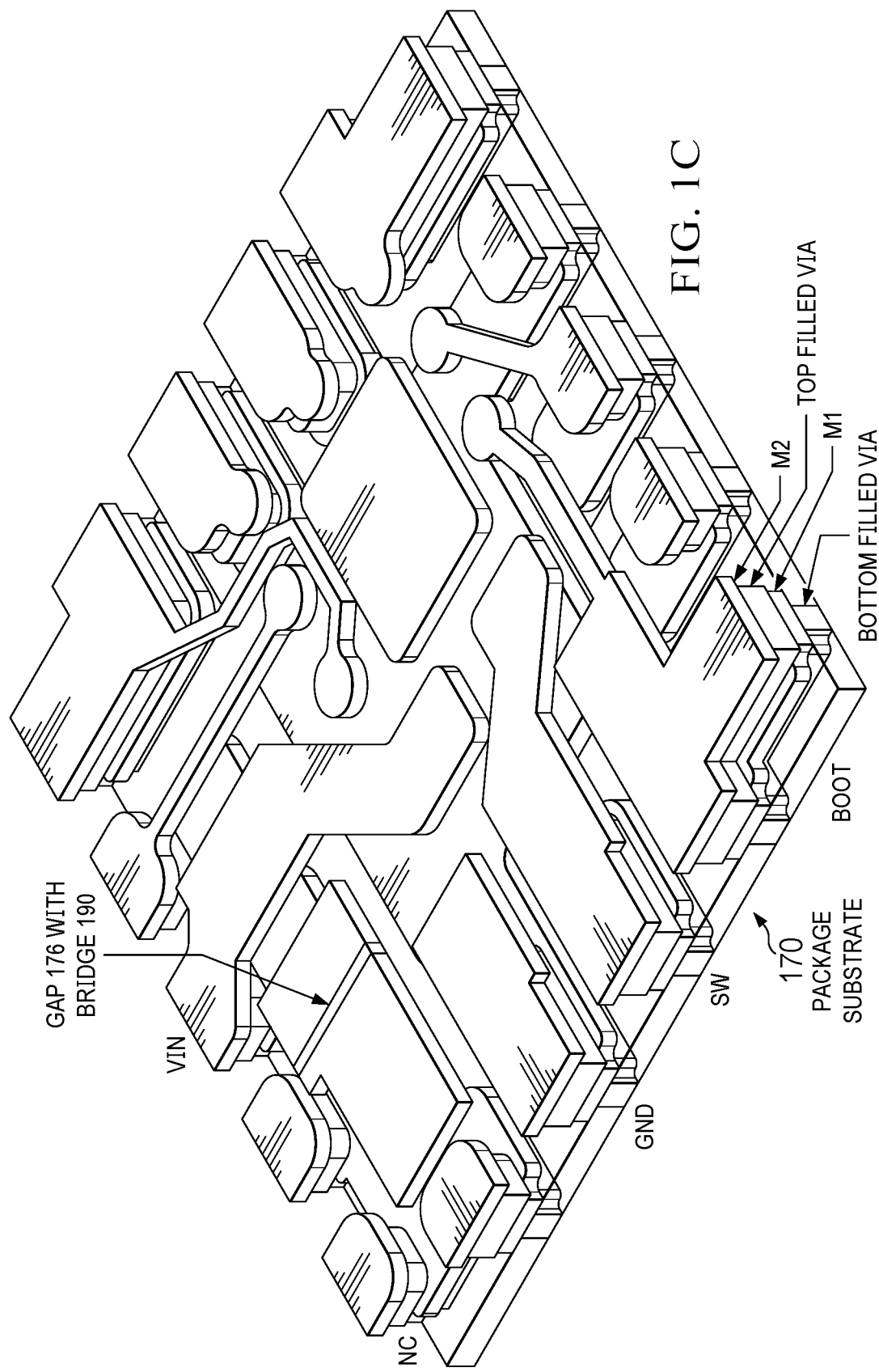
FIG. 1C is a top perspective view of the multilayer package substrate shown as part of the flipchip power package shown in FIG. 1B modified by removing the IC die and the capacitors to reveal the top layer of the package substrate.

FIG. 1C is a top perspective view of the multilayer package substrate 170 shown as part of the flipchip power package 150 shown in FIG. 1B modified by removing the IC die and the capacitors to reveal the top layer of the package substrate 170.

Figure 2:
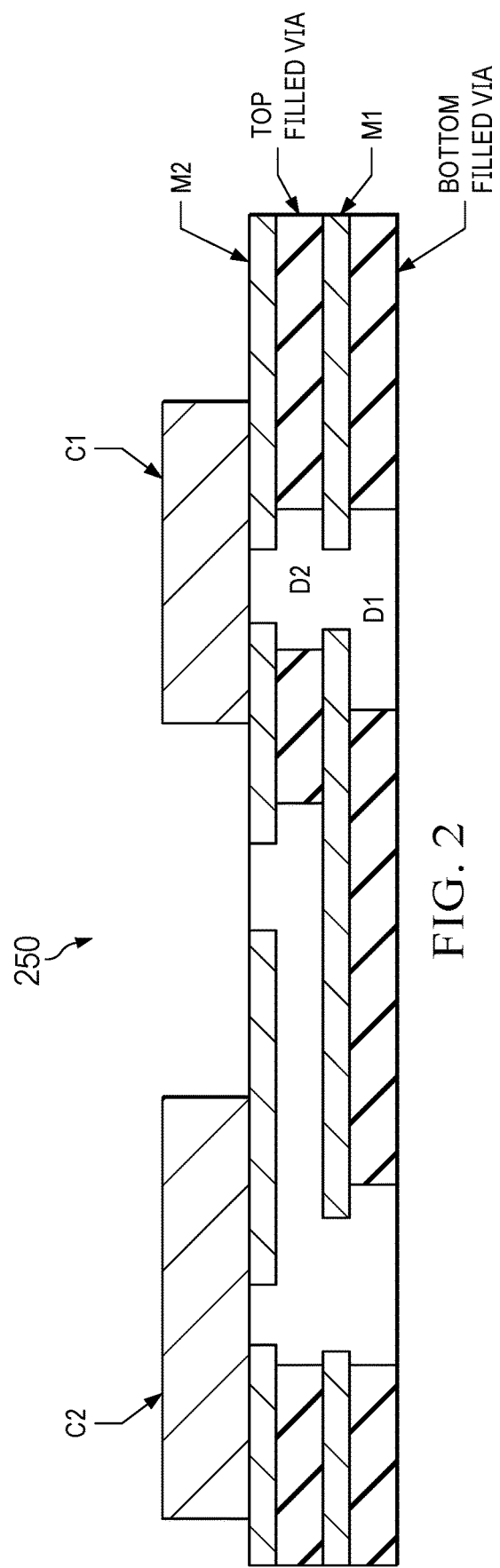
FIG. 2 is a cross-sectional view of the flipchip power package shown in FIG. 1B with the cut line running lengthwise through C1 and C2.

FIG. 2 is a cross-sectional view of the flipchip power package 150 shown in FIG. 1B with the cut line running lengthwise through C1 and C2, with the view shown as 250. D1 is as noted above is the bottom dielectric layer, M1 is the bottom metal layer, D2 is the top dielectric layer, and M2 is the top metal layer.

Figure 3:
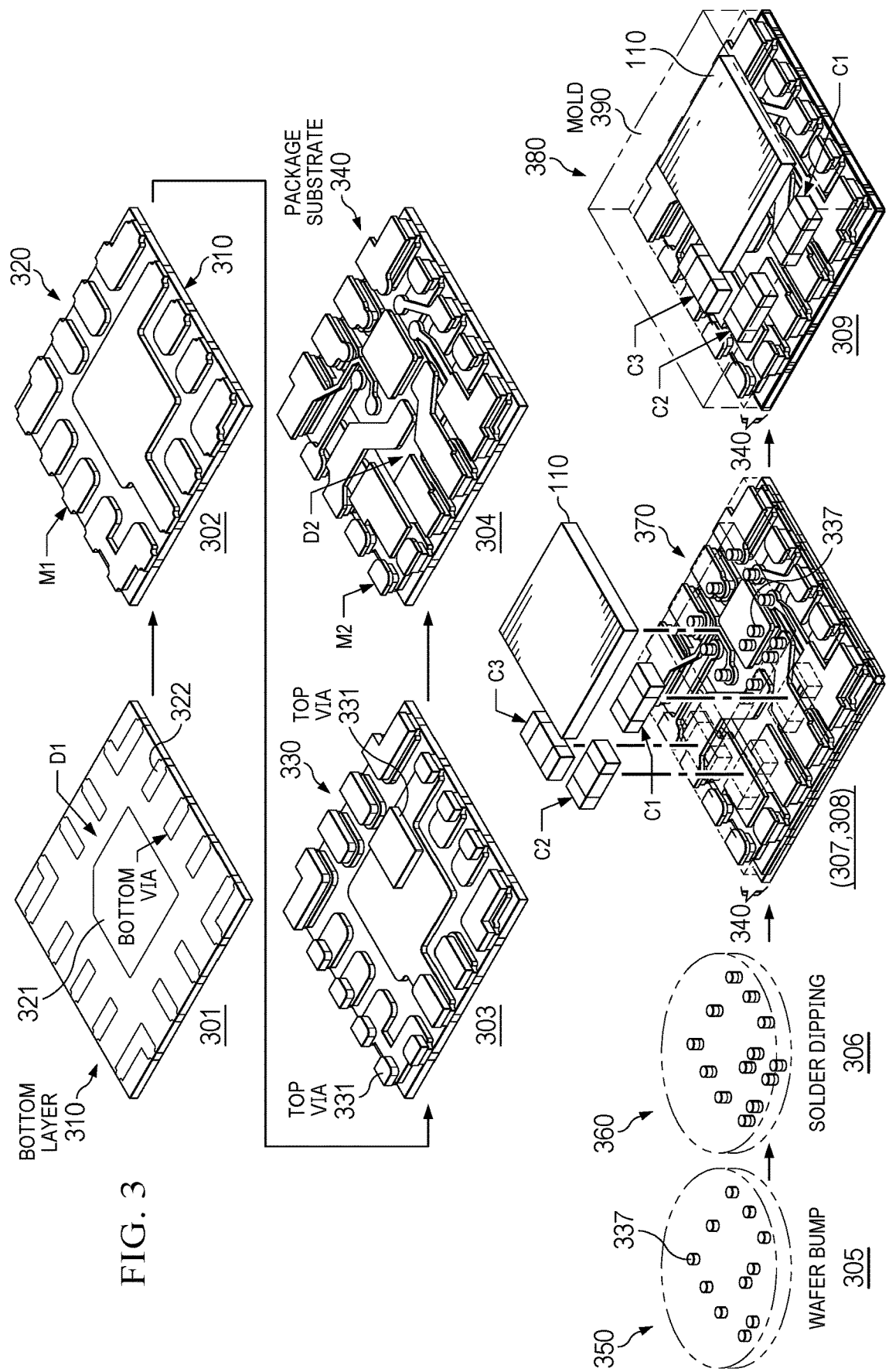
FIG. 3 shows an example assembly flow utilizing a multilayer package substrate having a top metal layer (M2) configured for selected lead terminal pairs to be in proximity which enables placing SMT capacitors between the lead pairs for a disclosed flipchip power package. Step 301 comprises forming a bottom layer including a bottom dielectric layer shown as D1 and bottom filled vias that resembles a leadframe in that it has a die pad surrounded by leads shown as lead terminals, and a plurality of traces connected to some of the lead terminals. Step 302 comprises forming a bottom metal layer shown as M1, with the result of step 302 shown. Step 303 comprises forming top filled vias extending through D2 to reach M1 with the result shown. Step 304 comprises forming a top metal layer shown as M2 which can make electrical contact to M1 through top filled vias that are through D2 with the result shown as a package substrate.

FIG. 3 shows an example assembly flow 300 utilizing a multilayer package substrate having a top metal layer configured for selected lead pairs to be in proximity which enables placing SMT capacitors between the lead pairs for forming a disclosed flipchip power package. Steps 301-304 which are involved in forming a disclosed package substrate shown as 340, which is generally performed simultaneously as a panel to form a plurality of package substrates, typically many hundreds or thousands of package substrates. Although assembly flow 300 is typically performed on a metal carrier, for simplicity a carrier is not shown.

Step 301 comprises forming a bottom layer including a bottom dielectric layer shown as D1 and bottom filled vias that resembles a leadframe in that it has a die pad 321 surrounded by leads shown as lead terminals 322, and a plurality of traces (not shown for simplicity) connected to some of the lead terminals 322. D1 in one arrangement can comprise an epoxy that is termed a Ajinomoto Build-up Film (ABF) material. Although not shown, bottom filled vias are generally formed through D1 before the forming of M1. Bottom filled vias (such as comprising copper) are formed through D1, such as using a plating process that can be the same process as used to form the top metal layer M2. Step 302 comprises forming the bottom metal layer shown as Ml, with the result of step 302 shown as 320.

Step 303 comprises forming top filled vias 331 extending through D2 to reach M1 with the result shown as 330. Step 304 comprises forming a top metal layer shown as M2 which can make electrical contact to M1 through the top filled vias 331 that as described above are through D2. Optionally analogously to that as described above regarding the bridge 190, the M2 layer features need not make electrical contact to M1. For example, the M1 may not be connected to any other metals inside the package substrate 340, but can be used instead as a "bridge" as described above relative to FIG. 1B to electrically connect two or more SMT components (such as capacitors or inductors) to be internally connected to provide enhanced performance by integrating the two or more SMT components in parallel or in series. A disclosed bridge also makes it possible to connect SMT components that are positioned relatively far away from each other. This is otherwise not possible in known leadframe-based technology because the other technology will always require the bridge to be exposed on the outside of package for plating purposes, which takes away otherwise usable space, and also causes unwanted parasitic coupling.

The result of step 304 is shown as package substrate 340. Some of the M2 traces are shown relatively close together, such as at a distance range of 15 μm to 50 μm, such as one arrangement about 30 μm, which enables mounting SMT capacitors or other discrete devices between the traces, which will be electrically coupled to some of the bond pads of the IC die after its flipchip attachment described below as step 307.

Step 305 comprises adding copper pillars 337, generally by plating, on bond pads of the respective IC die of a wafer, where the bumped wafers is shown as 350 that includes a plurality of IC die. Step 306 comprises solder dipping the bumped wafer 350 with generally a solder flux, with the resulting bumped wafer after solder fluxing shown as 360. Step 306 is generally performed in an assembly site, where the copper pillars 337 are dipped into a reservoir of solder in a suitable container so the solder material is attached to the copper pillar 337 because of surface tension. Wafer singulation then generally follows to provide a plurality of singulated IC die.

Step 307 comprises flipchip mounting respective ones of the IC die, generally using pick and place, to flip singulated IC die shown as 110 onto each of a plurality of disclosed package substrates, which as described above are generally physically interconnected to one another as a panel. Step 308 comprises mounting SMT components shown as capacitors C1, C2, and C3. The SMT components can also comprise inductors or resistors. In one arrangement, the SMT components mounted can include a first SMT component type, such as an SMT capacitor, and a second SMT component type, such as an SMT inductor or an SMT resistor.

For the mounting one may use a solder or another electrically conductive material such as a metal sintered conductive epoxy, or sintered Ag, such as using a pick and place process, between at least one pair of adjacent leads of the package substrate that are in proximity, which as described above is generally 15 μm to 50 μm, such as one arrangement about 30 μm. The result following steps 307 and 308 is shown as 370 which reflects the mounting of the IC die 110 and the capacitors C1, C2, and C3 onto the package substrate 340. Step 309 comprises molding to form encapsulating mold 390, followed by singulating the molded packages, with a resulting flipchip power package shown as 380 comprising the package substrate 340 that can have the same features as shown in FIG. 1B as power package 150.

Disclosed aspects can be integrated into a variety of assembly flows to form a variety of different semiconductor packages and related products. The semiconductor package can comprise a single IC die or multiple IC die, such as configurations comprising a plurality of stacked IC die, or laterally positioned IC die. A variety of package substrates may be used. The IC die may include various elements therein and/or layers thereon, including barrier layers, dielectric layers, device structures, active elements and passive elements including source regions, drain regions, bit lines, bases, emitters, collectors, conductive lines, conductive vias, etc. Moreover, the IC die can be formed from a variety of processes including bipolar, insulated-gate bipolar transistor (IGBT), CMOS, BiCMOS, and MEMS.

Those skilled in the art to which this Disclosure relates will appreciate that many variations of disclosed aspects are possible within the scope of the claimed invention, and further additions, deletions, substitutions and modifications may be made to the above-described aspects without departing from the scope of this Disclosure.

What is claimed is:

1. A method, comprising:
   forming a multilayer package substrate, comprising:
      forming a top layer including top filled vias through a top dielectric layer and a top metal layer providing a top surface of a plurality of leads and a plurality of traces connected to the plurality of leads, and
      forming a bottom layer including bottom filled vias including contact pads through a bottom dielectric layer and a bottom metal layer, wherein the top filled vias are for connecting the bottom metal layer to the top metal layer, and wherein the bottom filled vias are for connecting the bottom metal layer to the contact pads;
   attaching an integrated circuit (IC) die having a semiconductor surface including circuitry, with nodes in the circuitry electrically connected to bond pads, wherein the IC die is flipchip mounted onto the plurality of leads to provide an electrical connection to the bond pads;
   attaching at least one passive device surface mounted by an electrically conductive material on the top metal layer electrically connected between at least one adjacent pair of the plurality of leads; and
   forming a mold compound for encapsulating at least the IC die and the at least one passive device.

2. The method of claim 1, wherein the IC die comprises pillars on the bond pads, and wherein solder is on the top of the pillars.

3. The method of claim 1, wherein the IC die comprises a power device.

4. The method of claim 3, wherein the power device comprises a power converter, a power amplifier, a power switch, a power regulator, a DC/DC converter, or an AC/DC converter.

5. The method of claim 1, wherein at least a portion of the plurality of leads have a spacing of less than 0.6 mm between neighboring ones of the plurality of leads.

6. The method of claim 1, wherein the passive device comprises an inductor.

7. The method of claim 1, wherein the passive device comprises a first type of passive device and a second type of passive device.

8. The method of claim 1, wherein the multilayer package substrate consists of the top layer and the bottom layer.

9. The method of claim 1, wherein the at least one passive device comprises a first capacitor and a second capacitor, and wherein the first capacitor and the second capacitor are both in a capacitance range from 0.5 pF to 100 μF.

10. The method of claim 9, wherein the first capacitor and second capacitor are connected in parallel.

11. A method, comprising:
    forming a multilayer package substrate, comprising:
       forming a top layer including top filled vias through a top dielectric layer and a top metal layer providing a top surface of a plurality of leads and a plurality of traces connected to the plurality of leads, and
       forming a bottom layer including bottom filled vias including contact pads through a bottom dielectric layer and a bottom metal layer, wherein the top filled vias are for connecting the bottom metal layer to the top metal layer, and wherein the bottom filled vias are for connecting the bottom metal layer to the contact pads;
    attaching an integrated circuit (IC) die having a semiconductor surface including circuitry, with nodes in the circuitry electrically connected to bond pads, wherein the IC die is flipchip mounted onto the plurality of leads to provide an electrical connection to the bond pads;
    attaching at least one passive device surface mounted by an electrically conductive material on the top metal layer electrically connected between at least one adjacent pair of the plurality of leads; and
    forming a mold compound for encapsulating at least the IC die and the at least one passive device, wherein the at least one passive device comprises a first capacitor and a second capacitor, and wherein the forming the multilayer package substrate further comprises providing a bridge portion together with a first and a second of the top filled vias positioned to electrically connect adjacent first and second traces of the plurality of traces to connect the first capacitor and second capacitor in series.

12. The method of claim 11, wherein the first capacitor and the second capacitor are both in a capacitance range from 0.5 pF to 100 μF.

13. The method of claim 11, wherein the IC die comprises pillars on the bond pads, and wherein solder is on the top of the pillars.

14. The method of claim 11, wherein the IC die comprises a power device.

15. The method of claim 14, wherein the power device comprises a power converter, a power amplifier, a power switch, a power regulator, a DC/DC converter, or an AC/DC converter.

16. The method of claim 11, wherein at least a portion of the plurality of leads have a spacing of less than 0.6 mm between neighboring ones of the plurality of leads.

17. The method of claim 11, wherein the multilayer package substrate consists of the top layer and the bottom layer.

18. A method, comprising:
   forming a multilayer package substrate, comprising:
      forming a top layer comprising a plurality of top metal vias through a top dielectric layer and a top metal layer providing a top surface of a plurality of leads and a plurality of traces connected to the plurality of leads, and
      forming a bottom layer including a plurality of bottom metal vias including contact pads through a bottom dielectric layer and a bottom metal layer, wherein the plurality of top metal vias connect the bottom metal layer to the top metal layer, and wherein the plurality of bottom metal vias connect the bottom metal layer to the contact pads, and wherein the plurality of top metal vias and the plurality of bottom metal vias are filled;
   attaching an integrated circuit (IC) die having a semiconductor surface including circuitry, with nodes in the circuitry electrically connected to bond pads, wherein the IC die is flipchip mounted onto the plurality of leads to provide an electrical connection to the bond pads;
   attaching at least a first capacitor and a second capacitor, the first capacitor and the second capacitor being surface mounted on the top metal layer by an electrically conductive material, electrically connected between at least one adjacent pair of the plurality of leads;
   forming a bridge comprising at least a first top metal via and a second top metal via of the plurality of top metal vias positioned to electrically connect adjacent first and second traces of the plurality of traces to connect the first capacitor to the second capacitor; and
   forming a mold compound for encapsulating at least the IC die, the first capacitor and the second capacitor.

19. The method of claim 18, wherein the first capacitor and second capacitor are connected in parallel by the bridge.

20. The method of claim 18, wherein the first capacitor and second capacitor are connected in series by the bridge.

* * * * *